(12) United States Patent
Feldtkeller (10) Patent No.: US 7,587,193 B2
(45) Date of Patent: Sep. 8, 2009

(54) SIGNAL TRANSMISSION ARRANGEMENT HAVING A TRANSFORMER AND A RECEIVER CIRCUIT

(75) Inventor: Martin Feldtkeller, Munich (DE)

(73) Assignee: Infineon Technologies Austria AG, Villach (AT)

( * ) Notice: Subject to any disclaimer, the term of this patent is extended or adjusted under 35 U.S.C. 154(b) by 390 days.

(21) Appl. No.: 11/417,930

(22) Filed: May 3, 2006

(65) Prior Publication Data

US 2006/0276155 A1    Dec. 7, 2006

(30) Foreign Application Priority Data

May 3, 2005    (DE)    ........................ 10 2005 020 615

(51) Int. Cl.
*H01L 23/48* (2006.01)
*H04B 1/16* (2006.01)

(52) U.S. Cl. .................... 455/338; 455/292; 257/277; 257/566

(58) Field of Classification Search ................ 455/323, 455/280, 292, 337, 338; 257/777, 679, 531, 257/566; 330/301, 252, 54, 276; 336/84 M, 336/84 R, 200
See application file for complete search history.

(56) References Cited

U.S. PATENT DOCUMENTS 3,492,585 A * 1/1970 Ludlam .................... 455/343.1

| 5,701,037 | A | | 12/1997 | Weber et al. |
| 5,825,231 | A | * | 10/1998 | Chevallier et al. ............ 327/356 |
| 5,831,426 | A | * | 11/1998 | Black et al. .................. 324/127 |
| 5,925,849 | A | * | 7/1999 | Chen ........................... 174/482 |
| 6,420,952 | B1 | | 7/2002 | Redilla |
| 6,873,065 | B2 | * | 3/2005 | Haigh et al. ................. 307/412 |
| 6,927,662 | B2 | | 8/2005 | Kahlmann et al. |
| 2003/0042571 | A1 | * | 3/2003 | Chen et al. .................. 257/531 |
| 2003/0071708 | A1 | * | 4/2003 | Schmidt ..................... 336/220 |
| 2004/0102162 | A1 | | 5/2004 | Krumme et al. |
| 2006/0042390 | A1 | | 3/2006 | Halvorsrod et al. |

FOREIGN PATENT DOCUMENTS

| DE | 2710291 | 9/1977 |
| DE | 101 00 282 A1 | 7/2002 |
| DE | 102 32 642 A1 | 2/2004 |
| DE | 102 44 186 A1 | 4/2004 |
| DE | 102004 039218 | 3/2006 |
| DE | 102005039248 | 3/2006 |
| EP | 0 714 131 B1 | 1/1999 |
| WO | WO 02/086969 A2 | 10/2002 |

* cited by examiner

*Primary Examiner*—Blane J Jackson
(74) *Attorney, Agent, or Firm*—Maginot, Moore & Beck

(57) ABSTRACT

A signal transmission arrangement includes a transformer and a receiver circuit. The transformer has at least one primary winding and at least one secondary winding, each having first and second connections. The receiver circuit is connected to the secondary winding, and has an input and at least one output. The receiver circuit also has a differential input resistance approximating a short circuit. The receiver circuit is configured to convert a current pulse received at the input via the secondary winding to a voltage provided at the at least one output.

19 Claims, 7 Drawing Sheets

SIGNAL TRANSMISSION ARRANGEMENT HAVING A TRANSFORMER AND A RECEIVER CIRCUIT

FIELD OF THE INVENTION

The invention relates to a signal transmission arrangement having a transformer, and a receiver circuit which is connected on the secondary side to the transformer.

BACKGROUND

It is known for transformers, in particular integrated coreless transformers, to be used to transmit signals between DC-decoupled circuits. Transformers such as these are described, for example, in DE 101 00 282 A1 or DE 102 32 642. A circuit arrangement having a transformer as the signal transmission element, a transmission circuit which is connected on the primary side to the transformer and a receiver circuit which is connected on the secondary side to the transformer is described, for example, in DE 102 44 186 A1.

Owing to the lack of a ferromagnetic core, owing to the normally very small physical form in conjunction, and the use of thin metallization layers to produce the windings, transformers such as these are able to transmit only very short pulses or signals at very high carrying frequencies. The decay time constant (L/R) of a voltage pulse which can be tapped off on the secondary winding when a voltage pulse is applied to the primary winding is in the region of a few nanoseconds in the case of conventional coreless transformers with a diameter of about 400 μm, and the lower cut-off frequency ($R/2\pi L$) of a transformer such as this is accordingly more than 10 MHz. To a first approximation, this cut-off frequency is inversely proportional to the diameter of the planar windings of transformer, and increases further in the course of further miniaturization of the integrated transformers.

The receiver circuit, which is connected on the secondary side to the transformer, must be able to reliably detect the very short voltage pulses which are produced on the secondary side. This receiver circuit must have an upper cut-off frequency which is considerably above the lower cut-off frequency of the transformer.

It is known from the publication DE 102 44 186 A1 cited above as well as the publications WO 2002086969 A1 and EP 0 714 131 B1 for receiver circuits in signal transmission apparatuses to be produced with a coreless transformer using logic gates or Schmitt triggers using CMOS technology. The channel lengths of CMOS transistors must in this case be very short, in order to achieve short signal delay times in the receiver circuit, and thus a high upper cut-off frequency. The known receiver circuits, which are designed using CMOS technology, detect the voltage produced on the secondary coil and require signal levels on the secondary coil which are in the same order of magnitude as half the supply voltage of the receiver circuit. Only signals on the secondary side which are above this level are reliably identified as signal pulses.

However, CMOS transistors with short channel lengths can be produced only inaccurately, so that the switching thresholds and detector thresholds of the logic components which define the level of the signal pulses which can be processed may be subject to considerable manufacturing-dependent fluctuations. The receiver circuits must therefore be designed such that an adequate level margin is provided in order to make it possible to reliably evaluate a useful signal which is produced on the secondary coil.

Known receiver circuits furthermore have an input capacitance which is not negligible and which, together with unavoidable stray inductance on the secondary side of the transformer, forms a second-order low-pass filter, which limits the signal bandwidth of the signal pulses to be transmitted.

In the known receiver circuits, which tap the voltage off on the secondary winding, any stray capacitance on the secondary side of the transformer, which is normally present with respect to a substrate that is at the reference ground potential, also has a limiting effect on the signal bandwidth of processable signal pulses. It is known from WO 2002086969 A1, as cited above, and U.S. Pat. No. 6,420,952 B1, for a metallic shield to be provided between the primary winding and the secondary winding, and to be arranged closer to the secondary winding than to the primary winding. This metallic shield additionally increases this secondary stray capacitance.

In more recent receiver circuits produced using CMOS technology which can be finely structured, very thin gate oxides are used, which can easily be destroyed by overvoltages, caused by electromagnetic interference. Receiver circuits such as these must be protected by means of a surge arrestor, for example a zener diode. The depletion layer capacitance of the surge arrestor is connected in parallel with the input of the receiver circuit, and likewise has a bandwidth-limiting effect.

There is a need, therefore, for a signal transmission arrangement having a transformer and a receiver circuit, in which the receiver circuit reliably identifies the transmitted useful signal even in the case of a transformer with a short decay time constant, without having some or many of the disadvantages explained above.

SUMMARY

The above described needs, as well as others, may be achieved by a signal transmission arrangement according to one or more embodiments of the present invention.

A first embodiment is a signal transmission arrangement that includes a transformer and a receiver circuit. The transformer has at least one primary winding and at least one secondary winding, each having first and second connections. The receiver circuit is connected to the secondary winding, and has an input and at least one output. The receiver circuit also has a differential input resistance approximating a short circuit. The receiver circuit is configured to convert a current pulse received at the input via the secondary winding to a voltage provided at the at least one output.

A second embodiment of the invention is an apparatus, that includes a transformer and a receiver circuit. The transformer has at least one primary winding and at least one secondary winding, each having first and second connections. The receiver circuit is connected to the secondary winding, and has an input and at least one output. The receiver circuit is configured to convert a current pulse received at the input via the secondary winding to a voltage provided at the at least one output. The receiver circuit includes a first transadmittance amplifier coupled to the first connection of the secondary winding and a voltage source connected to the second connection of the secondary winding. The voltage source is configured to produce a voltage approximating a turn-on voltage of at least one amplifier device of the transadmittance amplifier.

The above-described features and advantages, as well as others will become more readily apparent to those of ordinary skill in the art by reference to the following detailed description and accompanying drawings.

DETAILED DESCRIPTION

The signal transmission arrangement comprises a transformer having at least one primary winding and at least one secondary winding, which each have first and second connections with the primary winding having a primary conduction path resistance, the secondary winding having a secondary conduction path resistance and the transformer having an output resistance which is dependent on the primary and the secondary conduction path resistance. A receiver circuit is connected to the secondary winding and has an input with a differential input resistance, and an output. In this signal transmission arrangement, provision is made for the differential input resistance of the receiver circuit to be less than the sum of the primary and secondary conduction path resistances, or less than the output resistance of the transformer. The differential input resistance of the receiver circuit in this case corresponds to the gradient of a current/voltage characteristic which is obtained when the respective voltage applied between the inputs is determined for different currents flowing into the receiver circuit, or the respective currents flowing into the receiver circuit are determined for different voltages applied to the inputs. A differential input resistance may vary as a function of the absolute value of the current or of the voltage, but is less than the output resistance of the transformer, and the sum of the primary and secondary conduction path resistances, for all values of the characteristic.

The receiver circuit is also designed to convert a current pulse flowing out of the secondary winding to a voltage which can be tapped off at an output.

In the signal transmission arrangement according to the invention, in which the input resistance of the receiver circuit is small in comparison to the conduction path resistances of the transformer windings and the output resistance of the transformer, a pulsed current flows into the secondary winding or out of the secondary winding when a voltage pulse is applied to the primary winding, with the direction of this current depending on the polarity of the voltage pulse applied to the primary. The current flowing in the secondary is detected by the receiver circuit in this transmission arrangement, and is converted to a voltage signal.

Owing to the small input resistance of the receiver circuit, the secondary winding of the transformer is operated virtually short-circuited. The voltage drop which occurs along the winding as a result of the conductor path resistance largely compensates for the voltage which is likewise induced along the winding. Stray capacitances of the secondary winding thus have no effect, or a negligible effect, on the bandwidth of the transmitted signal not only at the terminals but also over the entire extent of the secondary winding.

In the case of the arrangement according to the invention, the signal bandwidth of the transmitted signal is limited only by the stray inductance on the secondary side, which, together with the conduction path resistances, forms a first-order low-pass filter.

The receiver circuit has a transadmittance amplifier arrangement for conversion of the current pulse flowing in the secondary, and this is connected to the secondary winding. This transadmittance amplifier arrangement may have a first transadmittance amplifier for detection and processing of positive current pulses, and a second transadmittance amplifier for detection and processing of negative current pulses.

In order to inject voltage pulses into the primary, the signal transmission arrangement has a transmitter circuit which is connected to the primary winding and has a differential output impedance which is less than the primary conduction path resistance of the transformer.

The transformer is preferably a planar transformer without a ferromagnetic core.

Owing to their transmission characteristics, transformers are able to transmit only dynamic signals and pulsed signals. In order to transmit the information which is contained in a two-value signal, that is to say a signal which is either at a first signal level or at a second signal level, a voltage pulse of the first polarity is, for example, transmitted for a rising flank of this signal, and a voltage pulse of the opposite polarity to the first polarity is transmitted for a falling flange. On the secondary side, a voltage pulse of the first polarity leads to a current pulse in a first current direction, and a voltage pulse of the opposite polarity leads on the secondary side to a current pulse in the opposite current direction. These current pulses are detected by the receiver circuit and are converted to suitable voltage pulses. In order to reconstruct the two-value transmission signal at the receiver end, a storage circuit must be provided, for example a flipflop. This flipflop is preferably designed using bipolar technology or BiCMOS technology (BiCOMS=bipolar-CMOS). Flipflops such as these are distinguished by a high processing speed. A processing speed as high as this is required in order to allow reliable processing of even very short voltage pulses, which result from the short current pulses with a duration in the region of only a few nanoseconds, such as those which occur during transmission via a coreless transformer.

Unless stated to the contrary, identical reference symbols in the figures denote identical circuit components, elements and signals with the same meaning.

Figure 1:
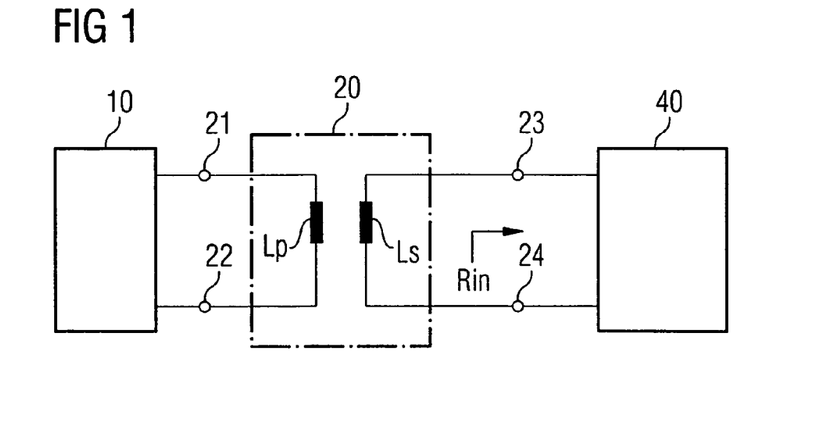
FIG. 1 shows, schematically, the basic design of a signal transmission arrangement having a transmitter circuit, a receiver circuit and a transmission path with a transformer running between the transmitter circuit and the receiver circuit.

FIG. 1 shows, schematically, the basic design of a signal transmission arrangement with a transmission path running between a transmitter circuit 10 and a receiver circuit 40. The transmission path has a transformer 20 with a primary winding Lp and a secondary winding Ls, and with primary connections 21, 22 and secondary connections 23, 24. The transformer 20 ensures DC decoupling between the transmitter circuit 10 on the primary side and the receiver circuit 40 on the secondary side.

In particular, the transformer 20 is a transformer without a transformer core (coreless transformer) which, for example, is in the form of an integrated transformer with planar windings.

Figure 2:
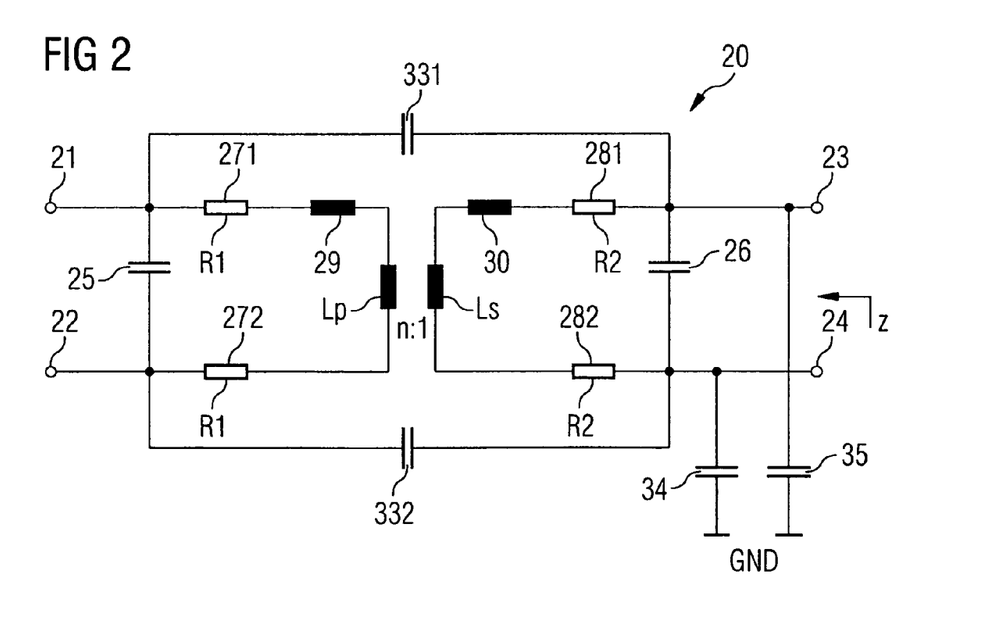
FIG. 2 shows the electrical equivalent circuit of a transformer.

FIG. 2 shows the electrical equivalent circuit of a transformer such as this, showing not only the primary winding and primary inductance Lp and the secondary winding and secondary inductance Ls but also parasitic components of a real transformer. Parasitic components such as these are capacitances 25, 26 which exist on the primary side and secondary side between the connecting terminals 21, 22 and 23, 24, as well as capacitances 331, 332 which are present between in each case one connection 21, 22 on the primary side and one connection 23, 24 on the secondary side. The major parasitic components of a transformer 20 such as this are conduction path resistances 271, 272, 281, 282 of the primary winding and of the secondary winding. These conduction path resistances are split symmetrically into in each case two resistances 271, 272 and 281, 282 for the primary side and the secondary side in FIG. 2, which are connected in series with the primary winding Lp and the secondary winding Ls, between the connecting terminals 21, 22 and 23, 24. Furthermore, there are stray inductances 29, 30 on both the primary side and the secondary side, which do not contribute to inductive coupling between the primary and the secondary.

By way of example, the secondary winding Ls is arranged in a manner that is not illustrated in any more detail on a substrate, for example a semiconductor substrate, and is dielectrically isolated from the substrate. By way of example, this substrate is at a reference ground potential GND on the secondary side. In the case of the constellation such as this, there are parasitic stray capacitances 34, 35 on the secondary side between the secondary connections 23, 24 and the secondary reference ground potential GND.

The output impedance of a transformer 20 such as this is governed by the conduction path resistances 271, 272, 281, 282 on the primary and secondary sides. This output impedance Z is given, as a function of the conduction path resistances, as:

$$Z = 2 \cdot R2 + 2 \cdot R1 \cdot 1/n^2 \quad (1).$$

The sum of the primary conductor path resistances 271, 272 is in this case given by 2·R1, and the sum of the secondary conduction path resistances 281, 282 is given by 2·R2. The turns ratio between the primary winding Lp and the secondary winding Ls is denoted by n in equation (1), and may be greater than unity depending on the purpose, that is to say the number of turns on the primary winding Lp is greater than the number of turns on the secondary winding Ls, or may be less than unity, that is to say the number of turns on the primary winding Lp is less than the number of turns on the secondary winding Ls. Depending on the turns ratio n:1, the output impedance Z of the transformer is greater than, less than or equal to the sum of the primary and secondary conduction path resistances. The sum R of the conduction path resistances 271, 272, 281, 282 is given by:

$$R = R \cdot R1 + 2 \cdot R2 \quad (2).$$

The value of the primary and secondary conduction path resistances is in each case in the range between a few tens and a few hundreds of ohms.

The transmission response of the transformer is governed primarily by the inductance of the primary and secondary windings Lp, Ls as well as the conduction path resistances 271, 272, 281, 282. The lesser the inductance of the primary winding Lp, and the greater the primary winding resistance 281, 282, the shorter is the decay time constant (L/R) and the shorter are the voltage pulses which can be tapped off on the secondary side when the secondary coil is operated on no-load, or the current pulses which can be tapped off on the secondary side when the secondary is operated short-circuited.

Figure 3:
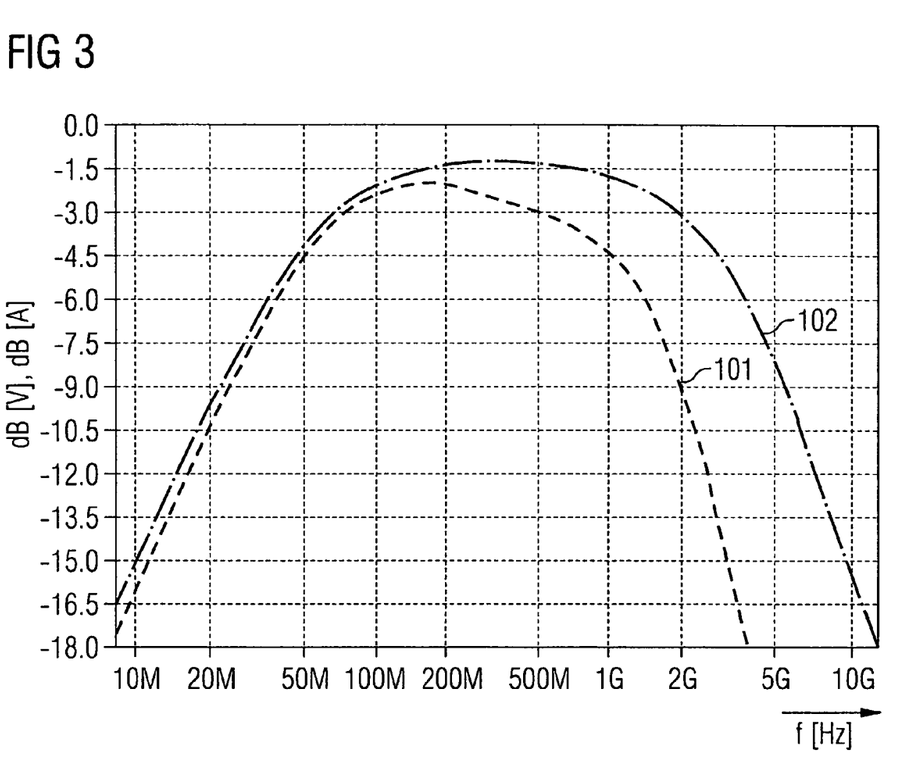
FIG. 3 shows, by way of example, the frequency responses of a transformer for its secondary no-load voltage and its short-circuit current.

FIG. 3 uses a curve 101 to show the frequency response of the no-load voltage, and a curve 102 to show the frequency response of the short-circuit current of a transformer which has a decay time constant of the primary coil of 3.3 nanoseconds, and thus a lower cut-off frequency of 50 MHz. As can be seen from this frequency response, the no-load voltage decreases again in the example for frequencies above about 200 MHz. This is because of a first-order low-pass filter which is formed by the secondary conduction path resistances (281, 282 in FIG. 2) and the secondary parasitic stray capacitances (34, 35 in FIG. 2), and which has a band-limiting effect on the transmitted signal. If the frequencies are increased even further, a second-order low-pass filter furthermore comes into effect, being formed by the secondary stray inductance (reference symbol 30 in FIG. 2) and the secondary output capacitance (26 in FIG. 2), and possibly by an input capacitance of a receiver circuit which is not illustrated in any more detail in FIG. 2.

As shown by the frequency response for the short-circuit current as illustrated in FIG. 3, the first-order low-pass filter which is formed by the secondary stray capacitances (34, 35 in FIG. 2) and the secondary conduction path resistance (281, 282 in FIG. 2) does not have a band-limiting effect on the short-circuit current. Provision is therefore made in the signal transmission arrangement according to an embodiment of the invention for the secondary winding of the transformer to be operated short-circuited, or at least approximately short-circuited, in order in particular to avoid the negative effects of the parasitic stray capacitances (34, 35 in FIG. 2) on the secondary side.

Figure 4:
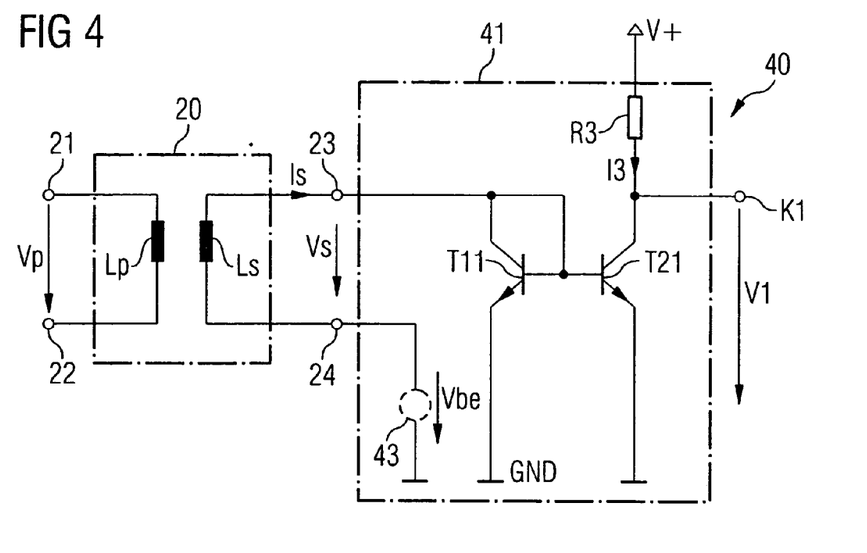
FIG. 4 shows a first exemplary embodiment of a signal transmission arrangement according to the invention which has a transformer and a receiver circuit, which is connected to a secondary winding of the transformer, with a signal processing path.

FIG. 4 shows a first exemplary embodiment of a signal transmission arrangement according to the invention, which has a transmission path with a transformer 20 and a receiver circuit 40, which is connected to the secondary side of the transformer 20. This receiver circuit in the example has a first transadmittance amplifier 41, which is connected to the secondary transformer connections 23, 24. The transadmittance amplifier 41 has a current mirror with an input transistor T11 connected as a diode and with an output transistor T21. The two transistors are in the form of bipolar transistors, in the example npn bipolar transistors. The input transistor T11 in the current mirror is connected between the first connection 23 of the secondary winding and a reference ground potential GND on the secondary side. The second connection 24 of the secondary winding is likewise connected to this reference ground potential GND. The load path, that is to say the collector-emitter path, through the output transistor T21 is connected in series with a first resistor R3 between a supply potential V+ and the secondary reference ground potential GND. One output K1 of the transadmittance amplifier 40 is formed by a node which is common to the output transistor T21 and to the first resistor R3 and at which an output voltage V1 with respect to the secondary reference ground potential GND is produced.

The method of operation of the transmission arrangement illustrated in FIG. 4 will be explained briefly in the following text. For this purpose, it should be assumed that a voltage pulse Vp is applied to the primary connections 21, 22 on the primary side by means of a suitable transmitter circuit, which is not illustrated in any more detail. The polarity of this voltage pulse Vp is chosen such that a positive voltage would be produced between the output connections 23, 24 on the secondary side if no receiver circuit 40 were connected, and such that a pulsed current Is would flow from the secondary winding Ls via the first connection 23 if a receiver 40 were connected. This current flow Is is mapped by the current mirror T11, T21 onto a current I3 flowing through the first resistor R3. This current I3 is proportional to the secondary current pulse Is via the ratio of the two current mirror transistors T11, T21, and corresponds to this secondary current Is when the two current mirror transistors are identical.

The output voltage V1 from the transadmittance amplifier 40 corresponds to the voltage produced between the terminal for the supply voltage V+ and the reference ground potential when the secondary current Is is zero. When the secondary current is not equal to zero, the output voltage V1 corresponds to the supply voltage V+minus the voltage drop across the first resistor R3. A current pulse Is with a current flow in the illustrated current direction causes a voltage pulse of the output voltage V1 which is negative with respect to the supply voltage V+ in the example.

When the current flow Is is in the direction shown in FIG. 4, the input transistor T11 of the current mirror is switched on. A voltage drop between the first connection 23 of the secondary winding Ls and the reference ground potential GND corresponds approximately to the value of the threshold voltage at the bipolar transistors T11, T21 when the input transistor T11 is switched on. This threshold voltage is referred to in the following text as Vbe. The input resistance of the transadmittance amplifier 41 corresponds to the switched-on resistance of the input transistor T11, which is connected as a diode T11. In order to further reduce this input resistance of the transadmittance amplifier, a voltage source 43 is preferably connected between the second connection 24 of the secondary winding Ls and the reference ground potential GND. This voltage source produces a voltage which corresponds at least approximately to the value of the threshold voltage Vbe of the bipolar transistors T11, T21. If there is an exact match between the voltage drop across the base-emitter junctions of the bipolar transistors T11, T21 and the voltage produced by the voltage source 43, the secondary winding Ls is operated exactly short-circuited. Even if there are minor discrepancies between the voltage drop across the transistors T11, T21 and the voltage which is produced by the voltage source 43, the secondary winding Ls is operated approximately short-circuited, that is to say the input resistance of the receiver circuit 40 is considerably less than the output resistance of the transformer, and the input resistance of the receiver circuit 40 is considerably less than the sum of the conduction path resistances of the primary winding Lp and secondary winding Ls of the transformer 20. If, for example, the amplitude of the secondary current Is is 5 mA, the differential input resistance is in the order of magnitude of 10 Ohms.

The signal transmission arrangement illustrated in FIG. 4 is able to identify the transmission of only those voltage pulses which cause a current through the secondary coil Ls in the direction illustrated in FIG. 4. Voltage pulses such as these which are injected on the primary side are converted on the receiver side to (negative) voltage pulses at the output terminal K1 of the transadmittance amplifier. A signal transmission arrangement such as this is suitable, for example, for use in transmission paths with two transformers, in which pulses which indicate a rising flank of a two-value transmission signal are transmitted via a transmission path, and signal pulses which indicate a falling flank of a two-value transmission signal are transmitted via a further, identically designed transmission path.

Figure 5:
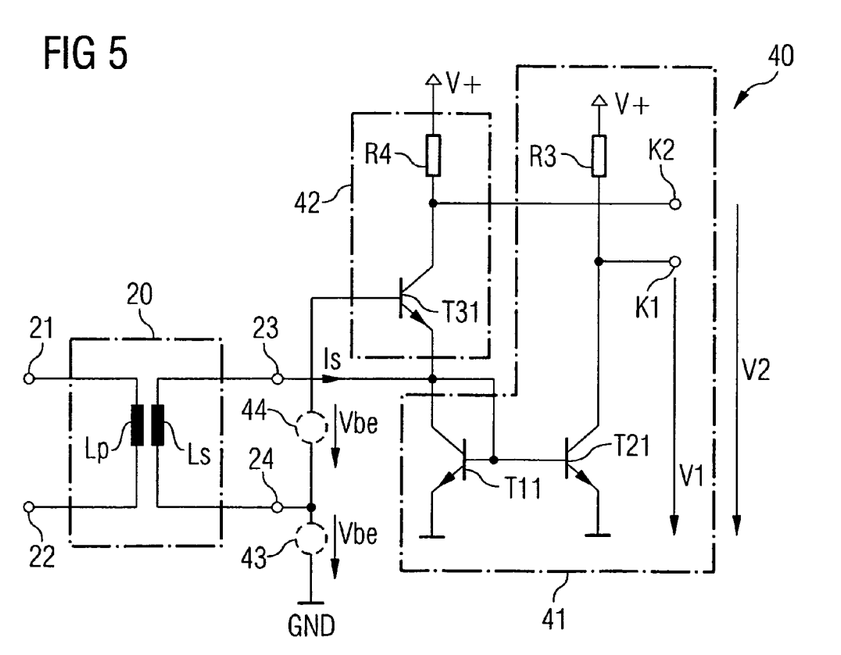
FIG. 5 shows a signal transmission arrangement according to the invention with a receiver circuit which has two signal paths for processing a current flowing in the secondary.

FIG. 5 shows one exemplary embodiment of a receiver circuit 40 which is suitable for identification not only of primary voltage pulses of a first polarity but also of primary voltage pulses of a second polarity, which is the opposite of the first polarity. The illustrated receiver circuit 40 has a first transadmittance amplifier 41, which has been explained with reference to FIG. 4 and has a current mirror, and a second transadmittance amplifier 42. The first transadmittance amplifier 41 is used for detection of current pulses in the current direction Is shown in FIGS. 4 and 5.

Current pulses in the opposite current direction are detected by the second transadmittance amplifier 42, which has a transistor T31 and a second resistor R4, which is connected in series with the load path of this transistor T31. The output of the second transadmittance amplifier 42 is formed by a node K2, which is common to the transistor T31 and the second resistor R4. A second output voltage V2 is produced with respect to the secondary reference ground potential GND at this output K2, and corresponds essentially to the supply voltage V+ when the transistor T31 is switched off. The series circuit with the transistor T31 and the resistor R4 is connected, in the example, in series with the input transistor T11 of the first transadmittance amplifier 41, between the terminal for the supply potential V+ and the reference ground potential. The method of operation of this second transadmittance amplifier 42 will be explained in the following text.

A current pulse in the opposite current direction to that shown in FIG. 5 switches the transistor T31 of the second transadmittance amplifier 42 on, so that the current flowing through the secondary winding Ls flows via the transistor T31 of the second transadmittance amplifier 42 to the supply potential V+. The voltage source 43 which is preferably provided in this case compensates for the voltage drop across the transistor T11 in the first transadmittance amplifier 41. A further voltage source 44 is preferably connected between the second connection 24 and the base connection of the transistor T31 of the second transadmittance amplifier 42 in order to compensate for the voltage drop across the base-emitter junction of the transistor T31 of the second transadmittance amplifier 42. This voltage source 44 produces a voltage which corresponds at least approximately to the threshold voltage of the transistor T31, which is in the form of a bipolar transistor, of the second transadmittance amplifier. When the transistor T31 is switched on, the potential at the second output terminal K2 falls during the duration of the current pulse, starting from the value of the supply potential V+, so that current pulses with a current direction that is the opposite of the current direction illustrated in FIG. 5 cause negative voltage pulses at the output K2 of the second transadmittance amplifier 42.

Figure 6:
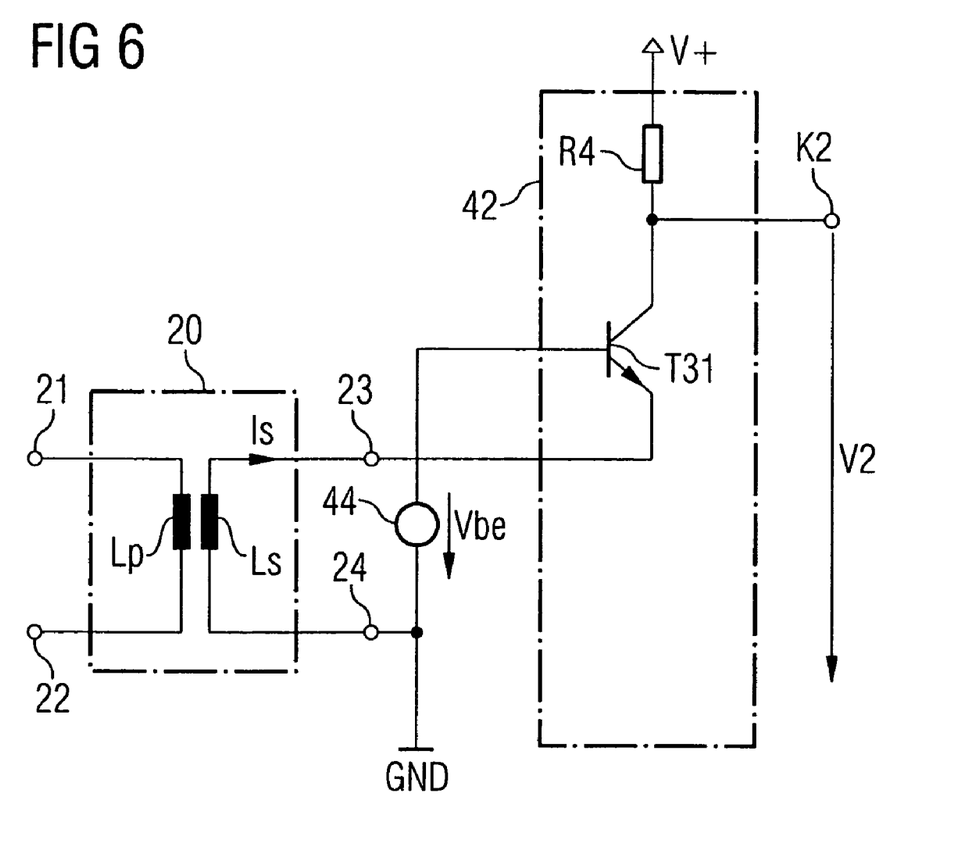
FIG. 6 shows a modification of the signal transmission arrangement shown in FIG. 5.

FIG. 6 illustrates a receiver circuit with only the second transadmittance amplifier 42, which converts only current pulses in the opposite direction to the current direction shown to voltage pulses at the terminal K2. This results from the omission of the transadmittance amplifier 41 from FIG. 5. For simplicity, it is possible in this case to dispense with the voltage source 43 provided on the circuit shown in FIG. 5, with the further voltage source 44 being connected directly to the reference ground potential GND.

Figure 7:
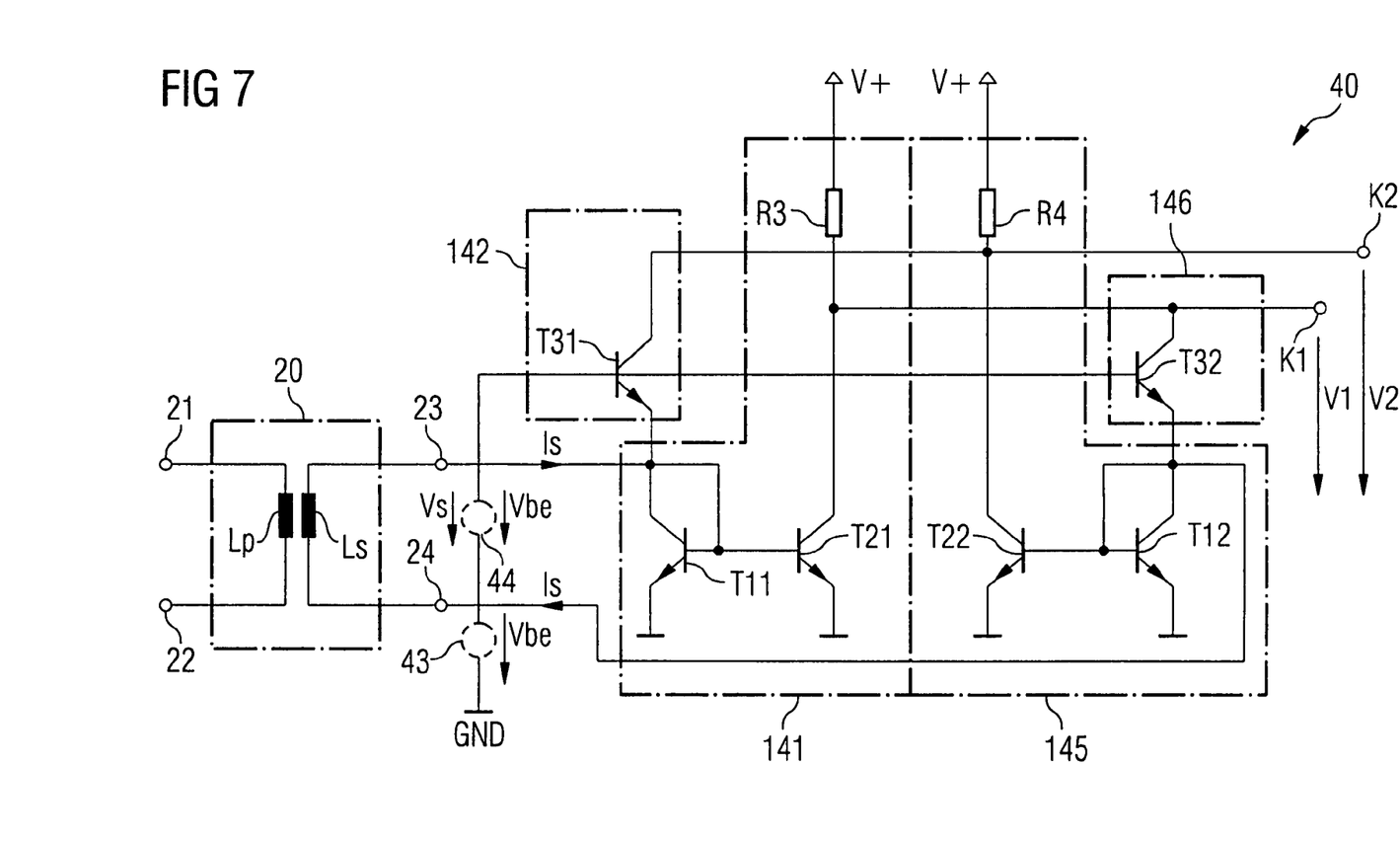
FIG. 7 shows a further exemplary embodiment of a signal transmission arrangement according to the invention.

FIG. 7 shows an exemplary embodiment of a receiver circuit 40 which has a first transadmittance amplifier arrangement 141, 146 and a second transadmittance amplifier arrangement 145, 142.

The first transadmittance amplifier arrangement 141, 146 has a first transadmittance amplifier 141 with a current mirror T1, T21. This first transadmittance amplifier 41 is in this case designed in a corresponding manner to the first transadmittance amplifier 41 as already explained with reference to FIGS. 4 and 5, and is connected by its input transistor T11 to the first connection of the secondary winding Ls.

The first transadmittance amplifier arrangement 141, 146 also has a second transadmittance amplifier 146 with a transistor T32. This second transadmittance amplifier 146 is designed in a corresponding manner to the second transadmittance amplifier 42, as has already been explained with reference to FIGS. 5 and 6. The second transadmittance amplifier 146, together with the output transistor T21 of the first transadmittance amplifier 141, jointly use a first resistor R3 which is connected between a node which is common to the output transistor T21 of the first transadmittance amplifier 141 and the transistor T32 of the second transadmittance amplifier 146, and the node for the supply potential V+. That load connection of the transistor T32 of the second transadmittance amplifier 146 which is remote from the resistor R3 is connected to the second connection of the secondary winding Ls.

The second transadmittance amplifier arrangement 145, 142 has a third transadmittance amplifier 145 with a current mirror T12, T22. This third transadmittance amplifier 145 is in this case designed in a corresponding manner to the first transadmittance amplifier 41, or the first transadmittance amplifier 141, which has already been explained with reference to FIGS. 4 and 5, but with its input transistor T12 connected to the second connection 24 of the secondary winding Ls.

The second transadmittance amplifier arrangement 145, 42 also has a fourth transadmittance amplifier 142 with a transistor T31. This second transadmittance amplifier 146 is designed in a corresponding manner to the second transadmittance amplifier 42, which has already been explained with reference to FIGS. 5 and 6, and is connected to the first connection 23 of the secondary winding Ls. Together with the output transistor T22 of the third transadmittance amplifier 145, the fourth transadmittance amplifier 142 jointly uses a second resistor R4, which is connected between a node which is common to the output transistor T22 of the third transadmittance amplifier 145 and the transistor T31 of the fourth transadmittance amplifier 142, and the node for the supply potential V+.

The output K1 of the first transadmittance amplifier arrangement 141, 146 is formed by a node which is common to the first resistor R3 and the transistors T21, T31 of the first and second transadmittance amplifiers 141, 146. The output K2 of the second transadmittance amplifier arrangement 145, 142 is formed by a node which is common to the second resistor R4 and the transistors T22, T32 of the third and fourth transadmittance amplifiers 145, 142.

The method of operation of this receiver circuit will be explained in the following text:

First of all, it is assumed that a voltage pulse has been applied to the primary winding Lp, inducing a current pulse Is in the current direction shown in FIG. 7 in the secondary winding Ls. The current Is flows on the one hand via the first connection 23 of the secondary winding Ls in the direction of the first transadmittance amplifier 141, and on the other hand from the second transadmittance amplifier 145 via the second connection 24 into the secondary winding Ls. The currents flowing through the first and second transadmittance amplifiers 141, 146 are added to form a current flow of twice the magnitude through the jointly used first resistor R3, and lead to a corresponding drop in the first output voltage V1.

A voltage pulse on the primary winding Lp in the opposite direction induces a current flow in the secondary winding Ls in the opposite direction to that illustrated. This current flows via the second connection 24 of the secondary winding in the direction of the third transadmittance amplifier 145, and from the fourth transadmittance amplifier 142 via the first connection 23 into the secondary winding Ls. The currents which flow through the third and fourth transadmittance amplifiers 145, 142 are added to form a current flow of twice the magnitude through the jointly used second resistor R4, and lead to a corresponding drop in the second output voltage V2.

A primary voltage pulse with a first polarity leads to a negative voltage pulse of the first output K1 via the first transadmittance amplifier arrangement with the first and second transconductance amplifiers 141, 146. A primary voltage pulse with a second polarity leads to a negative voltage pulse at the second output K2 via the second transadmittance amplifier arrangement with the third and fourth transconductance amplifiers 145, 142.

When a high common-mode voltage is applied to the terminals 21 and 22 of the primary winding Lp, but the voltages at the terminals 21 and 22 are the same, the rise in the common-mode voltage leads to a current flow through the parasitic coupling capacitances of the transformer, which are denoted by 331 and 332 in FIG. 2. If the rising and falling flanks of the common-mode voltage are very steep, the current flow through the parasitic capacitances may reach the same order of magnitude as that assumed by the secondary current when a voltage pulse is applied to the primary winding.

A positive common-mode voltage flank at the terminals 21 and 22 of the primary winding leads via the first terminal 23 of the secondary winding to a current flow into the first transconductance amplifier 141, and this results in a negative voltage pulse at the terminal K1. This common-mode voltage flank also leads via the second terminal 24 to a current flow into the third transconductance amplifier 145, which produces a negative voltage pulse at the terminal K2. In the case of a negative common-mode voltage flank, the current flows via the parasitic coupling capacitances and via the second and fourth transconductance amplifiers 146, 142, which likewise at the same time results in a negative voltage pulse at the outputs K1 and K2.

Secondary currents caused by common-mode voltages can thus be distinguished from secondary currents which are induced by a voltage pulse applied on the primary side, in that, in the case of a common-mode voltage flank, a negative voltage pulse appears at both outputs K1 and K2 at the same time, while a negative voltage pulse in each case appears at only one of the terminals K1, K2 when a voltage pulse is applied to the primary side. In the case of common-mode voltages, the difference between the output voltages V1, V2 thus remains at least approximately the same if the resistances R3, R4 are the same, while non-common-mode voltage pulses applied to the primary side result in a voltage difference between the outputs K1, K2 for the duration of the current pulse which is induced in the secondary.

Figure 8:
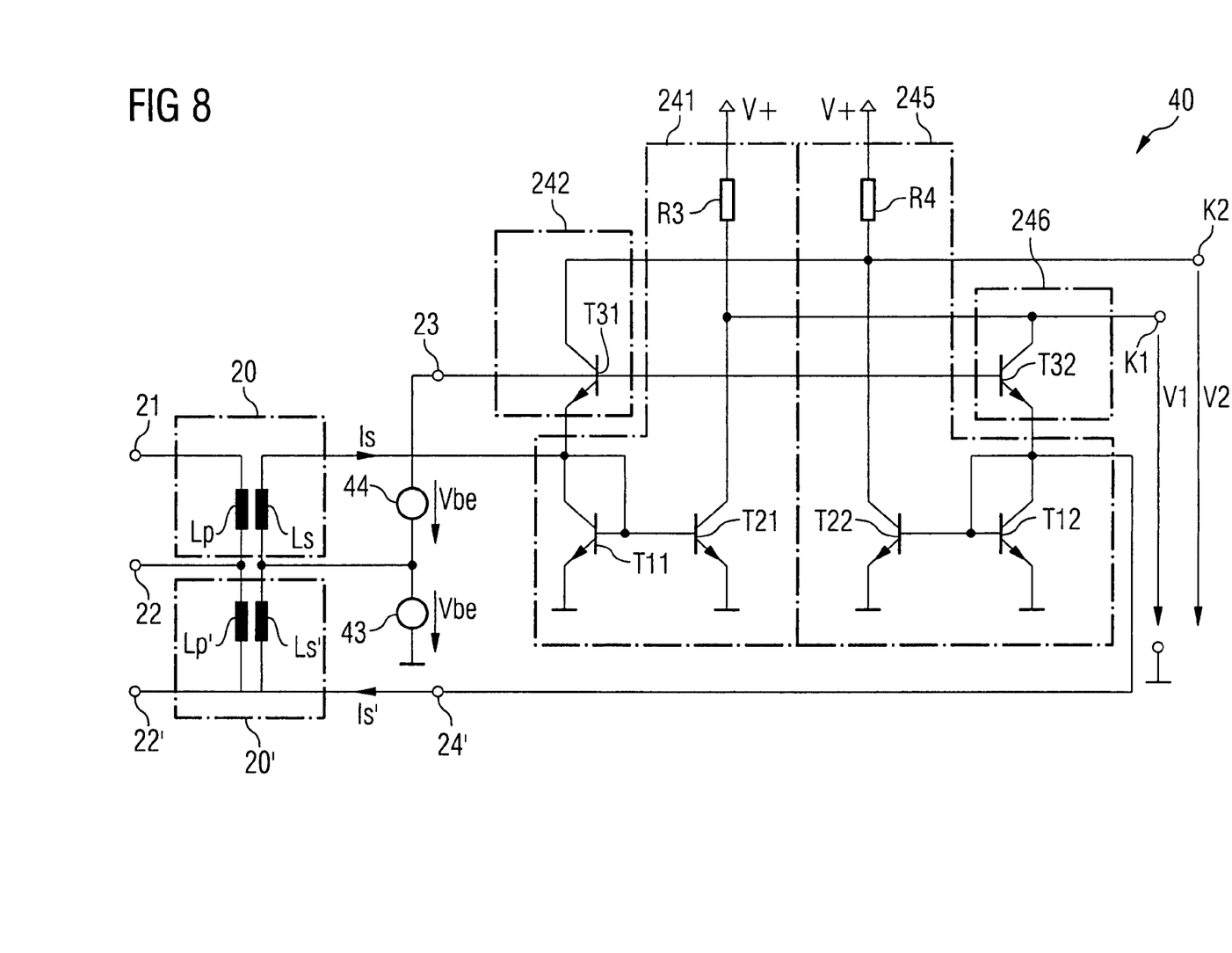
FIG. 8 shows an exemplary embodiment of a signal transmission arrangement according to the invention with two transformers.

FIG. 8 shows a further exemplary embodiment of a signal transmission arrangement according to the invention, which differs from that illustrated in FIG. 7 in that a further transformer 20' is provided in addition to the transformer 20. This further transformer 20' has a primary winding Lp' and a secondary winding Ls' corresponding to the transformer 20. The two primary windings Lp, Lp' and the two secondary windings Ls, Ls' of the transformers 20, 20' each have a common reference point, in that the further primary winding Lp' is connected between an input connection 22' and the second connection 22, and in that the further secondary winding Ls' is connected between a further output connection and the second secondary output 24.

The receiver circuit 40 has a first transadmittance amplifier arrangement 241, 242 with a first transadmittance amplifier 241 and a second transadmittance amplifier 242. The first transadmittance amplifier 241 is in this case designed in a corresponding manner to the first transadmittance amplifier 141 in the circuit in FIG. 7, and the second transadmittance amplifier 242 is designed in a corresponding manner to the fourth transadmittance amplifier 142 in the circuit shown in FIG. 7. The first and second transadmittance amplifiers 241, 242 are connected to the first connection 23 of the first secondary winding Ls.

The first transadmittance amplifier arrangement 241, 242 is used in this receiver circuit to detect the current pulses flowing into and out of the first secondary winding Ls. A secondary current as flowing in the illustrated direction in the first winding Ls leads, via the first transadmittance amplifier 241 and the first resistor R3, to a negative voltage pulse at the first output K1. A secondary current flowing in the opposite direction to that shown leads, via the second transadmittance amplifier 242 and the second resistor R4, to a negative voltage pulse at the second output K2.

The receiver circuit 40 also has a second transadmittance amplifier arrangement 145, 246 with a third and a fourth transadmittance amplifier 145, 246. The third transadmittance amplifier 245 is in this case designed in a corresponding manner to the third transadmittance amplifier 145 in the circuit in FIG. 7, and the fourth transadmittance amplifier 246 is designed in a corresponding manner to the second transadmittance amplifier 142 in the circuit shown in FIG. 7. The third and fourth transadmittance amplifiers 245, 246 are connected to the connection 24' of the second secondary winding Ls' that is remote from the common connection 24.

The second transadmittance amplifier arrangement 241, 242 is used, in this receiver circuit 40, to detect the current pulses flowing into and out of the second secondary winding Ls. A secondary current Is' flowing in the direction shown in the secondary winding Ls' leads, via the third transadmittance amplifier 245 and the first resistor R3, to a negative voltage pulse at the first output K1. A secondary current Is' flowing in the opposite direction to that shown leads, via the fourth transadmittance amplifier 246 and the second resistor R4, to a negative voltage pulse at the second output K2.

The first resistor R3 is shared by the first and third transadmittance amplifiers 241, 245 in this receiver circuit, so that the voltage drop across the first resistor R3, and hence the amplitude of the negative voltage pulse at the second output K2, are proportional to the sum of the currents flowing through these two transadmittance amplifiers 241, 245. In a corresponding manner, the second resistor R4 is shared by the second and fourth transadmittance amplifiers 242, 246 in this receiver circuit, so that the voltage drop across the second resistor R4, and hence the amplitude of the negative voltage pulse at the first output K1, are proportional to the sum of the currents flowing through these two transadmittance amplifiers 242, 246.

In a rest state, when no voltage pulse is applied to the primary windings Lp, Lp', no current flows in the secondary windings Ls, Ls'. The transistors in the two transadmittance amplifier arrangements 241, 242 and 245, 246, respectively, are thus not switched on, so that the voltage drops across the resistors R3, R4 are negligibly small. The output voltages V1, V2 from the transadmittance amplifiers 41, 45 thus correspond approximately to the supply potential V+.

If the first primary winding Lp is driven with a positive voltage pulse, that is to say a voltage pulse with a positive voltage between the first and the second input terminal 21, 22, and the second primary winding Lp is driven with a negative voltage pulse with a negative voltage between the input terminals 22' and 22, then this results in the current flow Is, Is' as illustrated in FIG. 8 in the secondary, and this leads to the negative voltage pulse at the first output K1.

If voltage pulses with opposite mathematical signs are applied to the primary, that is to say a negative voltage pulse is applied to the first primary winding Lp and a positive voltage pulse is applied to the second primary winding Lp', a current which corresponds to the sum of the magnitudes of the two currents induced in the secondary flows in a corresponding manner through the second resistor R4, as a result of which the second output voltage V2 is reduced during the time in which currents are induced in the secondary. The first output voltage V1 in this case remains essentially at the supply potential V+.

The illustrated signal transmission arrangement is preferably operated in such a way that the voltage pulses which are applied to the first and second primary windings Lp, Lp' are always complementary to one another, that is to say a positive voltage pulse is always applied to one of the two primary windings, while a negative voltage pulse is applied to the other of the two primary windings. The currents which are induced in the secondaries in this case always flow in opposite directions.

The voltage flanks on the primary windings are the critical factor for the induction of a current flow in the secondary windings. It is thus likewise possible to apply a positive voltage flank to one primary winding, that is to say the start of a positive pulse, while applying a negative voltage flank to the other primary winding at the same time, that is to say the end of a positive voltage pulse. Further details are described in the application document 10 2004 039 218.8 "Verfahren zur Datenübertragung über eine Datenübertragungsstrecke mit induktiven Übertragern und Datenübertragungsvorrichtung" [Method for data transmission via a data transmission path with inductive transformers and a data transmission apparatus].

It is now assumed that a common-mode interference signal is superimposed on the currents induced in the secondaries, and lead to currents or current components flowing in the same direction in the secondaries. The following explanation is based on the assumption that these currents or current components each flow from the secondary windings in the direction of the first and third transadmittance amplifiers 241, 245. The current component flowing out of the first secondary winding Ls leads via the current mirror T11, T21 of the first transadmittance amplifier 241 to a voltage drop across the first resistor R3, while the current or current component flowing from the second secondary winding Ls' leads, via the current mirror T12, T22 of the third transadmittance amplifier 245, to a voltage drop across the second resistor R4. The output voltages V1, V2 thus fall. On the assumption that the secondary current components which result from common-mode interference are each of the same magnitude, the voltage drops which are caused by these currents across the resistors R3, R4 are each the same, so that the difference between the output voltages V1, V2 is in each case zero, while the absolute values of these output voltages V1, V2 may change as a function of such common-mode interference signals.

Common-mode interference signals such as these may be caused, with reference to FIG. 2, by stray capacitances 321, 322 between the inputs and the outputs of the transformer when the voltage between the primary and secondary of the transformer changes with a high flank gradient. In this case, the stray capacitances between the windings result in a charge displacement current which can lead to current components flowing in the same direction in the secondaries.

Compensation, as already explained with reference to FIG. 8, for common-mode interference with the result that any difference between the output voltages V1, V2 is independent of this common-mode interference is important for those applications for which a two-value output signal Vout is intended to be produced from the current pulses induced in the secondaries.

Figure 9:
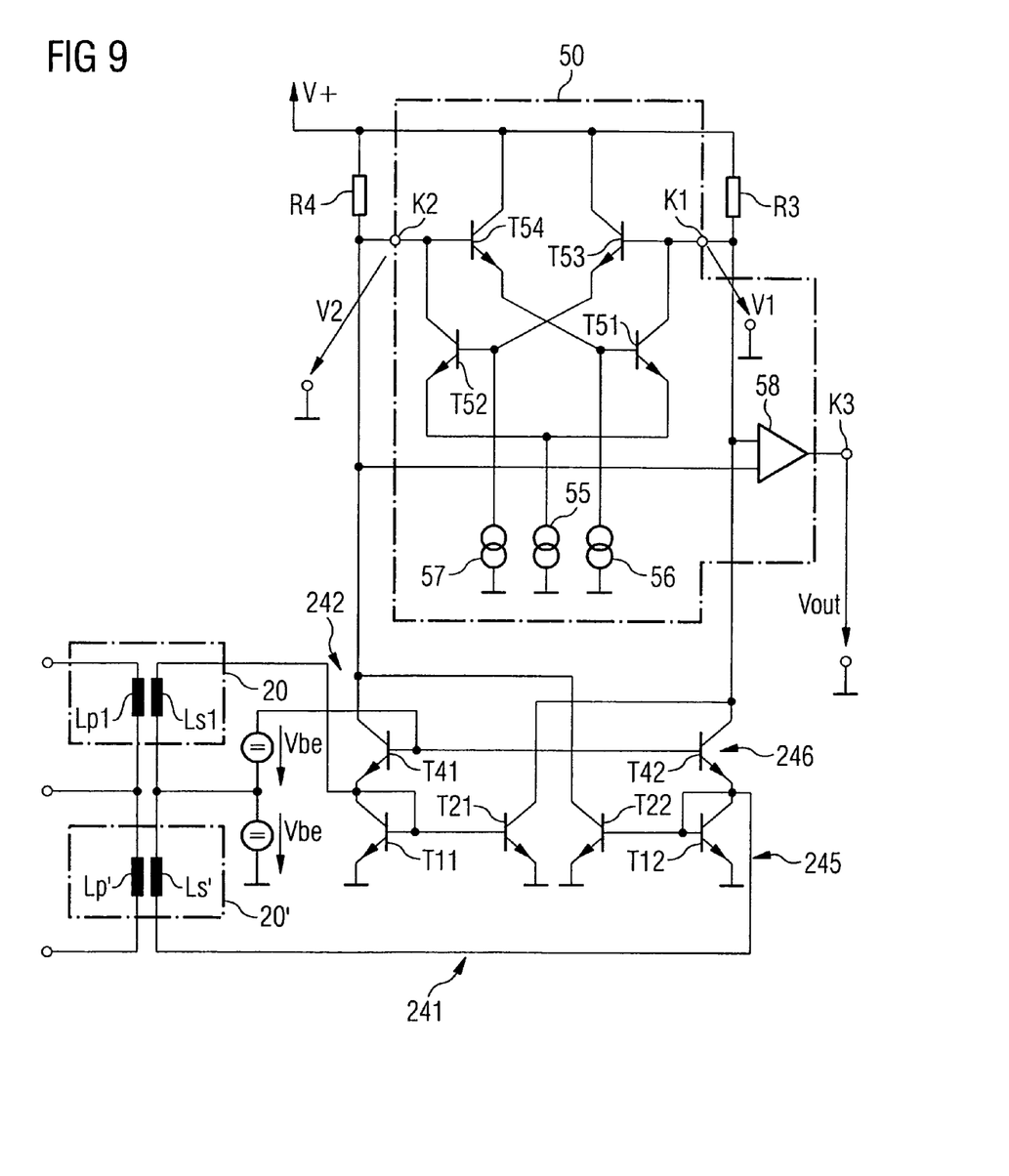
FIG. 9 shows an exemplary embodiment of a signal transmission arrangement according to the invention, in which the receiver circuit has a storage arrangement for production of a two-value output signal.

FIG. 9 shows the signal transmission arrangement as shown in FIG. 8, in which a storage circuit is provided in the form of a differential flipflop 50, which uses the first and second output voltages V1, V2 to produce a two-value output signal Vout at an output terminal K3. The illustrated flipflop 50 is designed using bipolar transistors and current sources. By way of example, a flipflop such as this may be designed using BiCMOS technology.

The illustrated flipflop is designed using four bipolar transistors. A first bipolar transistor T51 is connected with its load path between the first output K1 of the transadmittance amplifier arrangement and a first current source 55. A connection of this current source 55 which is remote from the transistor T51 is at the reference ground potential. A second transistor T52 is connected between the second output K2 of the transadmittance amplifier arrangement and this first current source 55. The current source 55 in this case forms a load for the two transistors T51, T52. The two transistors T51, T52 are cross-coupled via the base-emitter junctions of third and fourth bipolar transistors T53, T54. The base of the third bipolar transistor T53 is in this case connected to the first output K1 and thus to the collector connection of the first transistor T51, while the base of the fourth transistor T54 is connected to the second output K2, and thus to the collector of the second bipolar transistor T52. The collector connections of the third and fourth bipolar transistors T53, T54 are at the supply potential V+ in this example.

Furthermore, the flipflop has two further current sources 56, 57, one of which is connected between the base of the first transistor T51 and the reference ground potential GND, while the other is connected between the base of the second transistor T52 and the reference ground potential. This flipflop operates as explained in the following text:

The explanation is based on the assumption that voltage pulses are injected into the primaries of the transformers 20, 20' at a specific time, resulting in the output voltage V1 falling in a pulsed manner, while the second output voltage V2 remains essentially at the supply potential V+. The drop in the first output voltage V1 results in the third transistor T53 being controlled somewhat downwards, as a result of which the potential at the base connection of the second transistor T52 falls, and this transistor T52 is switched off, as a result of the current source 57 acting as a load. The supply potential at the second output K3 results in the fourth transistor T54 being switched on and thus switching on the first transistor T51, which results in the first output voltage V1 being held permanently at a low value, which is governed essentially by the current level in the load 55. A comparator 58 uses the output voltage V1, V2 to produce the two-value output signal Vout at the output terminal K3. If the output voltage V2 now falls, then the fourth transistor T54 is switched off, so that the potential at the base of the first transistor T51 falls, and this transistor T51 is switched off. The potential at the first terminal K1 thus rises, resulting in the third transistor T53 being switched on. This third transistor T53 switches the second transistor T52 on, as a result of which the fourth transistor T54 remains switched on even when the current pulse which is induced in the secondaries and initially resulted in a drop in the second output voltage V2 has already decayed.

The flipflop illustrated in FIG. 9 is able to react to very short changes in the output voltages V1, V2 and, as a reaction to these short voltage pulses, to produce permanent voltage levels at the outputs V1, V2 which are converted by the comparator 58 to the output signal Vout. The use of bipolar transistors makes it possible to set and to reset the state of the flipflop using signal levels in the order of magnitude of 200 mV. Very small values can thus be chosen for the values of the resistors. The time constants of parasitic capacitances and the resistance value are thus likewise very short. In contrast to this, the signal delay of a comparator is considerably longer, owing to the required voltage gain.

Furthermore, the flipflop is able not to react to voltage pulses which occur at the same time at the terminals K1 and K2. Thirdly, in particular, it is able to assume the correct state and to permanently store this when voltage pulses occur at the same time as a result of a steep voltage flank at the terminals K1 and K2, and voltage pulses of opposite polarity are applied at the same time to the primary windings result in a difference voltage being superimposed between the terminals K1 and K2.

It will be appreciated that the above described embodiments are merely illustrative, and that those of ordinary skill in the art may readily devise their own modifications and implementations that incorporates the principles of the present invention and fall within the spirit and scope thereof.

The invention claimed is:

1. A signal transmission arrangement, comprising:
a transformer with at least one primary winding and at least one secondary winding, each having first and second connections,
a receiver circuit connected to the secondary winding, the receiver circuit having an input, and at least one output, the receiver circuit having a differential input resistance being less than a sum of a primary conduction path resistance of the primary winding and a secondary conduction path resistance of the secondary winding or being less than an output resistance of the transformer, the receiver circuit configured to convert a current pulse received at the input via the secondary winding to a voltage provided at the at least one output.

2. The signal transmission arrangement as claimed in claim 1, further comprising a transmitter circuit connected to the primary winding, the transmitter circuit configured to have a differential output resistance which is less than the primary conduction path resistance of the transformer.

3. The signal transmission arrangement as claimed in claim 1, wherein which the receiver circuit includes at least one amplifier arrangement that receives an input current and provides an output voltage and is connected to the secondary winding.

4. The signal transmission arrangement as claimed in claim 3, wherein the at least one amplifier arrangement has a first amplifier connected to one of the first and second connections of the secondary winding and has a first output terminal forming a first of the at least one output.

5. The signal transmission arrangement as claimed in claim 4, wherein the at least one amplifier arrangement further comprises a second amplifier connected to one of the first and second connections of the secondary winding and has a second output terminal forming a second of the at least one output.

6. The signal transmission arrangement as claimed in claim 5, wherein the second amplifier has a further transistor which has a control input which is coupled to the secondary winding, with the further transistor being coupled to an output which forms the second output terminal.

7. The signal transmission arrangement as claimed in claim 5, further comprising a storage circuit connected to the first and second output terminals and is designed to assume a first or a second state depending on the first and second output voltage, and to make available at an output a signal which is dependent on the state.

8. The signal transmission arrangement as claimed in claim 7, wherein the storage circuit includes a flip-flop operably coupled to the first and the second output terminal.

9. The signal transmission arrangement of as claimed in claim 8, wherein the storage circuit further comprises
a comparator connected between the first and the second output terminal and operably coupled to the transistor circuit.

10. The signal transmission arrangement of as claimed in claim 9, wherein the flip flop further comprises
a transistor circuit having a first transistor, a second transistor, a third transistor and a fourth transistor.

11. The signal transmission arrangement as claimed in claim 10, wherein the first, second, third and fourth transistors of the transistor circuits are bipolar transistors.

12. The signal transmission arrangement as claimed in claim 9, wherein the set and reset times of the flip flop are shorter than the signal delay time of the comparator circuit.

13. The signal transmission arrangement as claimed in claim 3, wherein the at least one amplifier arrangement comprises:
a first amplifier connected to the first connection of the secondary winding,
a second amplifier which is connected to the second connection of the secondary winding,
a common first output of the first and second amplifiers.

14. The signal transmission arrangement as claimed in claim 13, further comprising:
a third amplifier which is connected to the second connection of the secondary winding,
a fourth amplifier which is connected to the first connection of the secondary winding,
a common second output connected to each of the first and second amplifiers.

15. The signal transmission arrangement as claimed in claim 1, further comprising a second transformer having a primary winding and a secondary winding, wherein:
the secondary windings of the transformer and the second transformer have a common reference point,
the secondary winding of the first transformer is connected to a first amplifier arrangement that receives an input current and provides an output voltage and with at least one first output terminal in order to produce a first output voltage, and
the secondary winding of the second transformer is connected to a second amplifier arrangement that receives an input current and provides an output voltage and which is connected to the at least one first output terminal.

16. The signal transmission arrangement as claimed in claim 15, wherein the first amplifier arrangement has a first amplifier connected to the first output terminal, and has a second amplifier connected to a second output terminal.

17. The signal transmission arrangement as claimed in claim 16, wherein which the second amplifier arrangement has a third amplifier connected to the first output terminal, and has a fourth amplifier connected to the second output terminal.

18. An apparatus, comprising:
a transformer with at least one primary winding and at least one secondary winding, each having first and second connections,
a receiver circuit connected to the secondary winding, the receiver circuit having an input, and at least one output, the receiver circuit configured to convert a current pulse received at the input via the secondary winding to a voltage provided at the at least one output, the receiver circuit including a first amplifier that receives an input current and provides an output voltage and coupled to the first connection of the secondary winding and a voltage source connected to the second connection of the secondary winding, the voltage source configured to produce a voltage approximating a turn-on voltage of at least one amplifier device of the first amplifier; and
wherein the first amplifier includes a current mirror with an input transistor and an output transistor, the input transistor coupled to the secondary winding, and the output transistor coupled to a first output terminal.

19. The apparatus as claimed in claim 18 wherein the voltage source is configured to produce a voltage approximating a turn-on voltage of the input transistor.

* * * * *